United States Patent
Sato et al.

(10) Patent No.: US 7,331,024 B2
(45) Date of Patent: Feb. 12, 2008

(54) POWER-CONSUMPTION CALCULATION METHOD AND APPARATUS

(75) Inventors: Koichi Sato, Kanagawa (JP); Hiroshi Shibuya, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 294 days.

(21) Appl. No.: 11/093,148

(22) Filed: Mar. 30, 2005

(65) Prior Publication Data
US 2005/0223344 A1 Oct. 6, 2005

(30) Foreign Application Priority Data
Mar. 31, 2004 (JP) ............... 2004-106460

(51) Int. Cl.
*G06F 17/50* (2006.01)

(52) U.S. Cl. ............ 716/4; 716/5; 716/6; 716/18

(58) Field of Classification Search ........ 716/4–6, 716/18; 703/14, 18–19, 23
See application file for complete search history.

(56) References Cited

U.S. PATENT DOCUMENTS

| 5,692,160 | A | * | 11/1997 | Sarin | ............... | 703/23 |
| 5,801,958 | A | * | 9/1998 | Dangelo et al. | ............... | 716/18 |
| 6,782,354 | B1 | | 8/2004 | Ikegami | | |
| 2004/0019859 | A1 | * | 1/2004 | Ravi et al. | ............... | 716/4 |

FOREIGN PATENT DOCUMENTS

JP   2001-109788 A   4/2001
JP   2001-265847 A   9/2001

OTHER PUBLICATIONS

ORINOCO "Behavioral Level Low Power Estimation", http://www.chipvision.com/ pp. 1-11.

* cited by examiner

Primary Examiner—Paul Dinh
(74) Attorney, Agent, or Firm—Foley & Lardner LLP

(57) ABSTRACT

An apparatus for calculating power consumption includes a behavioral synthesis unit for generating a clock-level description by behavioral synthesis of an algorithm description; a clock-level simulation unit for simulating a clock-level description and calculating operating ratios of storage elements and arithmetic units indicated by the clock-level description; a storage-element power calculation unit for calculating a predicted value of power consumption of a storage element portion based upon a power calculation formula, which has been read out of a power-calculation-formula file, and the operating ratios of the storage elements; and a combinational-circuit power calculation unit for calculating a predicted value of power consumption of an arithmetic unit portion based upon a power calculation formula, which has been read out of the power-calculation-formula file, and the operating ratios of the arithmetic units, and calculating a predicted value of power consumption of a combinational circuit, with the exception of arithmetic units, based upon a power calculation formula, which has been read out of the power-calculation-formula file, the operating ratios of the storage elements and arithmetic units and the operating ratios of input/output ports.

14 Claims, 8 Drawing Sheets

FLOW OF DATA

FIG.9　　　　　　　　　　　　　　　PRIOR ART

POWER-CONSUMPTION CALCULATION METHOD AND APPARATUS

BACKGROUND OF THE INVENTION

1. Field of the Invention

This invention relates to a power-consumption calculation method and apparatus. More particularly, the invention relates to a power-consumption calculation method and apparatus for calculating a predicted value of power consumed by a semiconductor device to be designed.

2. Description of the Related Art

Semiconductor devices such as system LSI chips bear circuits of ever greater scale. In order to design them, use is made of a top-down design technique for implementation from a high level of abstraction to a low level of abstraction. Broadly speaking, the top-down technique has three design stages, namely a behavioral level, RT (Register Transfer) level and gate level. Ordinarily, in the designing of a semiconductor device, verification of operation, verification of processing capability and verification of power consumption, etc., are performed by simulation. In particular, there is a tendency for a semiconductor device mounted on a portable device to be required to have a high performance with little consumption of power, and verification of consumed power at the design stage is of growing importance.

FIG. 8 illustrates a procedure for estimating power consumption by conducting a simulation at the gate level. Such estimation of power consumption at the gate level is as described in the specification of Japanese Patent Application Laid-Open No. 2001-265847 (Patent Document 1). In the designing of a system LSI chip or the like, an algorithm description 21 in which the functions of the semiconductor device (macro blocks) to be designed are described is converted to a hardware description (RTL description) 23 at the RT level by a behavioral synthesis unit 22. The RTL language 23 is converted to hardware language (gate-level netlist) 25 at the gate level by a logic synthesis unit 24.

Predicted values of power consumption of hardware (gates) such as multiplexers and registers are registered in a gate-power library 26 on a per-technology basis. On the basis of the gate-level list 25 input thereto, a power calculation unit 27 acquires power values, which conform to the operating states of each of the gates, from the gate-power library 26 while conducting a simulation at the gate level.

With estimation of power consumption at the gate level, the accuracy of estimation of power consumption of the semiconductor device to be designed can be improved by increasing the accuracy of the predicted value of power consumption of each gate registered in the gate-power library 26. However, simulation at the gate level takes time and using such estimation method of power consumption at the gate level in the designing of a semiconductor device, particularly one having circuitry of large scale, is unrealistic.

Power-consumption estimation in which a simulation is conducted at the RT level is available as a technique for shortening the time needed to estimate power consumption. FIG. 9 illustrates a procedure for estimation of power consumption in which a simulation is performed at the RT level. In the case of such power consumption at the RT level, the RTL description 23 obtained by behavioral synthesis is co-simulated by an RTL co-simulation unit 28. In the simulation, operating ratios that indicate the toggle rates or toggle transition probabilities of those gate circuits, which are to construct the semiconductor device, corresponding to storage elements such as registers and memories specified by the RTL description 23 are calculated.

The gate-level netlist 25 obtained by logic synthesis of the RTL description 23 and an operating ratio 29 of the storage element calculated by the RTL co-simulation unit 28 are input to an operating-ratio setting unit 30, which sets the operating ratio to each gate included in the gate-level netlist 25. With regard to those gates that correspond to the storage elements, the RTL description 23 and gate-level netlist are in one-to-one correspondence, and therefore the operating-ratio setting unit 30 sets the operating ratio of a gate corresponding to a storage element using, as is, the operating ratio 29 of the storage element that has entered from the RTL co-simulation unit 28.

With regard to gates other than those corresponding to storage elements, the RTL description 23 and gate-level netlist are not in one-to-one correspondence. Consequently, the operating ratio of the gate of a storage element cannot be input from the RTL co-simulation unit 28. However, since a gate other than one corresponding to a storage element is usually bracketed by storage elements or input pins, the operating ratio of this portion can be estimated from the operating ratio 29 of the storage element. Accordingly, the operating-ratio setting unit 30 causes the operating ratio 29 of the storage element or the operating ratio from the input pin to propagate through the netlist and sets the operating ratio of a gate other than a storage element. A power calculation unit 32 estimates the consumed power of each gate statically using an operating-ratio file 31, which is output from the operating-ratio setting unit 30 and in which an operating ratio has been set for every gate, and the gate-power library 26, thereby estimating the overall power consumption of the semiconductor device to be designed.

In estimation of power consumption at the RT level, the power calculation unit 32 estimates power consumption without conducting a simulation at the gate level. Since the level at which the simulation is performed is thus the RT level, which has a higher level of abstraction than the gate level, the estimation of power consumption at the RT level takes less time than the estimation of power consumption at the gate level illustrated in FIG. 8. However, in a case where the scale of the circuitry of the semiconductor device is large, a sufficiently high speed cannot be obtained even with estimation of power consumption at the RT level. This means that there is a need to perform the estimation of power consumption at still higher speed.

The art described in ORINOCO "Behavioral Level Low Power Estimation" <http://www.chipvision.com/> (Non-Patent Document 1) is an example of a technique that makes it possible to estimate power consumption at higher speed. FIG. 10 is a flowchart indicating the manner of estimation of power consumption described in Non-Patent Document 1. According to this technique, a routine for calculating operating ratio is inserted into an algorithm description (A) 41 described at the behavioral level (step S101), an algorithm description (B) 42 is obtained and this is simulated (step S102). This is a data structure generated by behavioral synthesis from the algorithm (B) 42. A CDFG (Control Data Flow Graph), which is produced by processing (scheduling) that converts the description of the algorithm to a cycle operation, is generated (step S103).

An operating-ratio file 43, which is obtained by the simulation at step S102, is assigned to the CDFG (step S104) generated at step S103, constraints such as number of resources and timing are set and processing that corresponds to binding processing implemented by operation synthesis is executed (step S105). According to Non-Patent Document 1, power consumption of the device to be designed is estimated at a level higher than the RT level based upon the environment thus constructed (step S106).

According to power-consumption estimation shown in FIG. 10 in which a simulation is conducted at a level higher than the RT level, the operating ratio is calculated by performing the simulation at the behavioral level, and the operating ratio is utilized to estimate power consumption in an environment constructed by generation of the CDFG and binding processing. In this case, estimation of power consumption can be speeded up but the algorithm description is an untimed description in which time has not been set. A problem which arises, therefore, is that the accuracy of the estimation of power consumption is low in comparison with a case where a hardware model is simulated dynamically. Further, there is no assurance that the environment constructed by CDFG generation and binding processing will correspond to the RTL description obtained later by behavioral synthesis of the algorithm description. A problem which arises, therefore, is that there is no assurance that the power consumption of a semiconductor device to be designed will be estimated correctly.

The specification of Japanese Patent Application Laid-Open No. 2001-109788 (Patent Document 2) describes a technique whereby a simulation of a semiconductor device to be designed can be performed at high speed. This reference proposes the clock level as a level whose degree of abstraction is lower than that of the operating level and higher than that of the RT level. The clock-level description differs from the RTL description, which is a structural description, in that it is a cycle-based description; it is a hardware model that operates at the same timing as that of the RTL description. According to Patent Document 2, a simulation is conducted using such a clock-level description. If the clock-level description and RTL description are compared with regard to the same hardware model, it will be understood that the clock-level description involves an amount of description less than that of the RTL description. This is advantageous in that the simulation can be performed at higher speed. However, a technique that uses a clock-level simulation to estimate the power consumption of a semiconductor device to be designed has not been known heretofore. Thus, there is much to be desired in the art.

SUMMARY OF THE INVENTION

Accordingly, an object of the present invention is to provide a power-consumption calculation method and apparatus for calculating, at high speed, a predicted value of power consumption of a semiconductor device to be designed, while suppressing a decline in prediction accuracy.

According to the present invention, there is provided a novel power-consumption calculation method for calculating a predicted value of power consumption of a semiconductor device to be designed. The method comprises the steps of: simulating a clock-level description in which operation of the semiconductor device to be designed is described as clock-level operation; calculating operating ratios of storage elements and arithmetic units indicated by the clock-level description; and calculating a predicted value of power consumption of each storage element and arithmetic unit based upon the calculated operating ratios of the storage elements and arithmetic units and a power calculation formula that has been prepared for respective ones, i.e., every type of storage element and arithmetic unit.

Further, according to the present invention, the foregoing object is attained by providing a power-consumption calculation apparatus for simulating a clock-level description in which operation of a semiconductor device to be designed is described as clock-level operation and calculating a predicted value of power consumption of a semiconductor device to be designed, comprising: storage-element power calculation means for calculating operating ratios of storage elements indicated by the clock-level description, and calculating a predicted value of power consumption of each storage element based upon the calculated operating ratios of the storage elements and a calculation formula for calculating power consumption of the storage elements; and combinational-circuit power calculation means for calculating operating ratios of arithmetic units indicated by the clock-level description, and calculating a predicted value of power consumption of each arithmetic unit based upon the calculated operating ratios of the arithmetic units and a power calculation formula for calculating power consumption of the arithmetic units.

The method and apparatus for calculating power consumption according to the present invention simulate a clock-level description in which the functions of a semiconductor device to be designed are described as operations on a clock-by-clock basis, count the toggles of portions corresponding to storage elements and arithmetic units, obtain operating ratios indicated as toggle rates or toggle transition probabilities, and calculate predicted values of power consumption of the storage elements and predicted values of power consumption of the arithmetic units. According to the present invention, simulation is performed at the clock level and therefore the operating ratio can be obtained at higher speed in comparison with a case where a simulation is performed at a level having a lower level of abstraction. Further, one-to-one correspondence is attained between storage elements and arithmetic units indicated by a clock-level description and storage elements and arithmetic units, respectively, indicated by an RTL description to undergo logic synthesis later. As a result, predicted values of power consumption of storage elements and arithmetic units of a semiconductor device to be designed can be calculated with an accuracy the same as that in a case where these operating ratios are obtained by performing a simulation at the RT level.

The method of calculating power consumption according to the present invention preferably further comprises a step of calculating a predicted value of power consumption of a combinational circuit other than arithmetic units based upon the calculated operating ratios of the storage elements and arithmetic units and a power calculation formula prepared in conformity with the combinational circuit other than arithmetic units. The apparatus for calculating power consumption according to the present invention preferably is such that the combinational-circuit power calculation means further calculates a predicted value of power consumption of a combinational circuit other than arithmetic units based upon a power calculation formula for calculating power consumption of a combinational circuit other than of arithmetic units and the calculated operating ratios of the arithmetic units and operating ratios of the storage elements calculated by the storage-element power calculation means.

With a simulation of the clock-level description, the operating ratio of a combinational circuit other than arithmetic units cannot be obtained directly and a predicted value of the power consumption of this portion cannot be calculated. With the present invention, the operating ratio of a combinational circuit other than arithmetic units is set to a value that has been estimated based upon the operating ratios of storage elements and arithmetic units. As a result, a predicted value of power consumption of a combinational circuit other than arithmetic units can be calculated.

In the method of calculating power consumption according to the present invention, the step of calculating a predicted value of power consumption of a combinational circuit other than arithmetic units is such that if one or more of each of a storage element and arithmetic unit exist on a data path bracketing a combinational circuit other than arithmetic units to be calculated, a predicted value of power consumption of the combinational circuit other than arithmetic units is calculated using the operating ratios of the one or more storage elements and arithmetic units. In the apparatus for calculating power consumption according to the present invention, if one or more of each of a storage element and arithmetic unit exist on a data path bracketing a combinational circuit other than arithmetic units to be calculated, then the combinational-circuit power calculation means preferably calculates a predicted value of power consumption of the combinational circuit other than arithmetic units using the operating ratios of the one or more storage elements and arithmetic units.

For example, when a plurality of storage elements and a plurality of arithmetic units exist in a data path bracketing a combinational circuit other than arithmetic units, it is possible to adopt an arrangement in which a predicted value of power consumption is calculated by setting the operating ratio of the combinational circuit other than the arithmetic units to a value obtained by averaging the average of the operating ratios of the plurality of storage elements and the average of the operating ratios of the plurality of arithmetic units.

In the method of calculating power consumption according to the present invention, the step of calculating a predicted value of power consumption of a combinational circuit other than arithmetic units is such that if one or more storage elements exist on a data path bracketing a combinational circuit other than arithmetic units to be calculated, a predicted value of power consumption of the combinational circuit other than arithmetic units is calculated using the operating ratios of the one or more storage elements. In the apparatus for calculating power consumption according to the present invention, if one or more storage elements exist on a data path bracketing a combinational circuit other than arithmetic units to be calculated, then the combinational-circuit power calculation means preferably calculates a predicted value of power consumption of the combinational circuit other than arithmetic units using the operating ratios of the one or more storage elements.

For example, when a plurality of storage elements exist in a data path bracketing a combinational circuit other than arithmetic units, it is possible to adopt an arrangement in which a predicted value of power consumption is calculated by setting the operating ratio of the combinational circuit other than the arithmetic units to an average value of the operating ratios of the plurality of storage elements.

In the method of calculating power consumption according to the present invention, the step of calculating a predicted value of power consumption of a combinational circuit other than arithmetic units is such that if one or more arithmetic units exist on a data path bracketing a combinational circuit other than arithmetic units to be calculated, a predicted value of power consumption of the combinational circuit other than arithmetic units is calculated using the operating ratios of the one or more arithmetic units. In the apparatus for calculating power consumption according to the present invention, if one or more arithmetic units exist on a data path bracketing a combinational circuit other than arithmetic units to be calculated, then the combinational-circuit power calculation means preferably calculates a predicted value of power consumption of the combinational circuit other than arithmetic units using the operating ratios of the one or more arithmetic units.

For example, when a plurality of arithmetic units exist in a data path bracketing a combinational circuit other than arithmetic units, it is possible to adopt an arrangement in which a predicted value of power consumption is calculated by setting the operating ratio of the combinational circuit other than the arithmetic units to an average value of the operating ratios of the plurality of arithmetic units.

In the method of calculating power consumption according to the present invention, the step of calculating the predicted value is such that the power consumption of each storage element can be calculated on the assumption that a clock signal is input only when data is written to the storage element. In the apparatus for calculating power consumption according to the present invention, the storage-element power calculation means is capable of calculating a predicted value of power consumption of each storage element on the assumption that a clock signal is supplied only when data is written to the storage element.

For example, a predicted value of power consumption of each storage element may be calculated by assuming that a clock signal is being supplied to the clock terminal of each storage element at all times without taking clock gating into consideration. Alternatively, the power consumption of a storage element may be calculated by assuming that a clock signal is supplied to the clock terminal of each storage element at the time of data rewrite without taking clock gating into consideration.

The method of calculating power consumption according to the present invention further comprises a step of assuming a virtual wiring area based upon the clock-level description and carrying out wiring of CTS (Clock Tree Synthesis) wiring in the virtual wiring area while calculating positions of buffers, which are inserted into the virtual wiring, based upon driving capability of the buffers and wiring capacitance of the virtual wiring; and a step of calculating a predicted value of power consumption by CTS based upon number of buffers that have been inserted into the virtual wiring at the step of wiring the CTS wiring. The apparatus for calculating power consumption according to the present invention further comprises CTS power calculation means for assuming a virtual wiring area based upon the clock-level description, carrying out wiring of CTS wiring in the virtual wiring area while calculating positions of buffers, which are inserted into the virtual wiring, based upon driving capability of the buffers and wiring capacitance of the virtual wiring, and calculating a predicted value of power consumption by CTS based upon number of buffers that have been inserted into the virtual wiring. In this case, the predicted value of power consumption by CTS can be calculated at a stage prior to that at which actual layout information is obtained.

The method of calculating power consumption according to the present invention further comprises a step of assuming gate size based upon the clock-level description and calculating a predicted value of leakage power based upon the gate size assumed. The apparatus for calculating power consumption according to the present invention further comprises leakage-power calculation means for assuming gate size based upon the clock-level description and calculating a predicted value of leakage power based upon the gate size assumed. In this case, it is possible to calculate a predicted value of leakage power of a semiconductor device to be designed.

With the method and apparatus for calculating power consumption according to the present invention, the operating ratios of storage elements and arithmetic units are obtained by simulating a clock-level description, and a predicted value of power consumption of a semiconductor device to be designed is calculated. As a result, a predicted value of power consumption can be calculated at high speed by performing a simulation at the RT level while suppressing a decline in the accuracy of the power-consumption prediction.

Other features and advantages of the present invention will be apparent from the following description taken in conjunction with the accompanying drawings, in which like reference characters designate the same or similar parts throughout the figures thereof

DESCRIPTION OF THE PREFERRED EMBODIMENT

A preferred embodiment of the present invention will now be described in detail with reference to the drawings.

Figure 1:
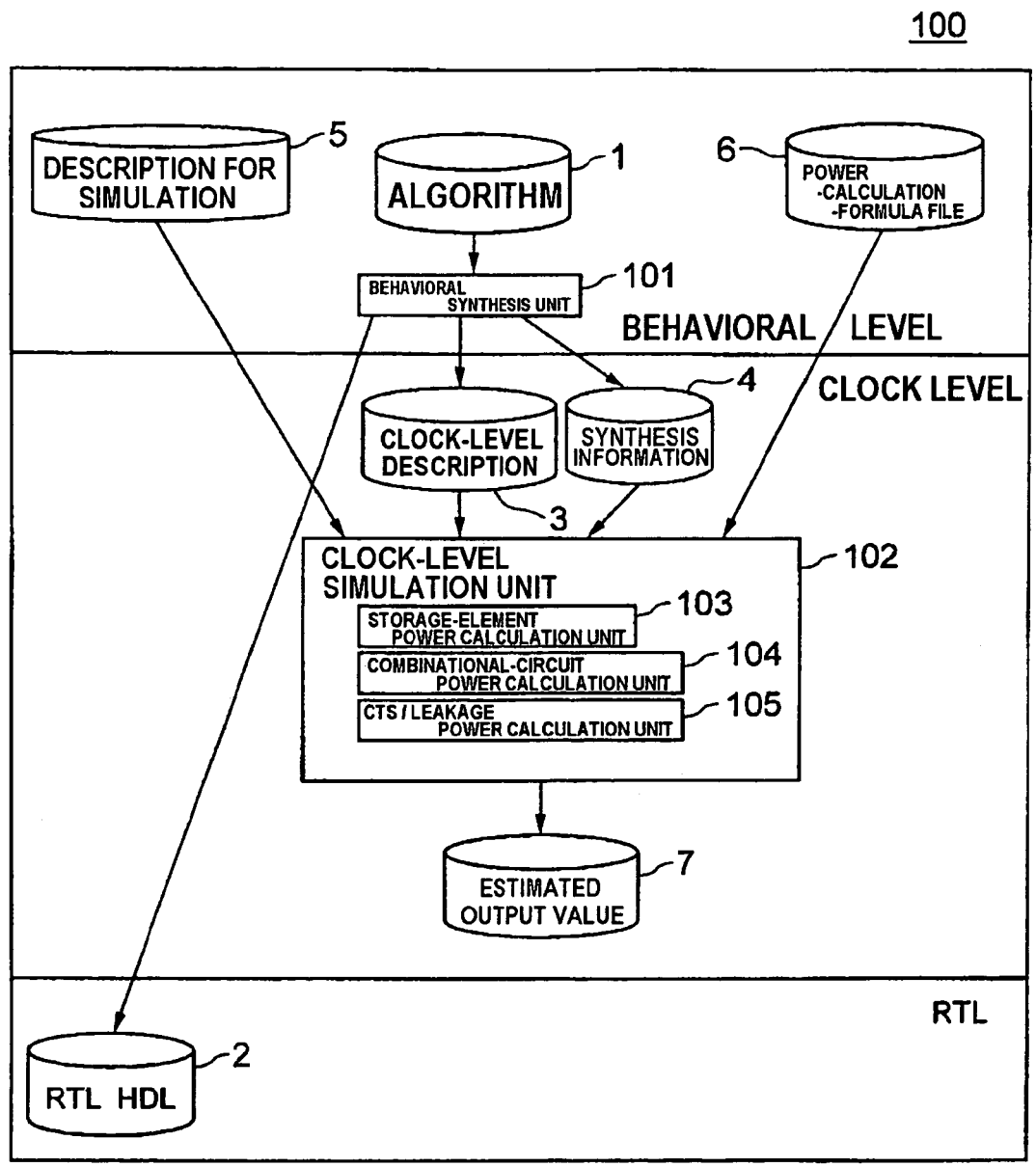
FIG. 1 is a block diagram illustrating how power consumption is estimated by an apparatus for estimating power consumption according to an embodiment of the present invention.

FIG. 1 illustrates how a predicted value of power consumption is calculated by an apparatus 100 for estimating power consumption according to an embodiment of the present invention. The power-consumption estimating apparatus 100 includes a behavioral synthesis unit 101 implemented using a computer system and a clock-level simulation unit 102. The clock-level simulation unit 102 includes a storage-element power calculation unit 103, a combinational-circuit power calculation unit 104 and a CTS/leakage power calculation unit 105. The power-consumption estimating apparatus 100 estimates a predicted value of power consumption by performing a simulation at the clock level, the degree of abstraction of which is lower than that of the behavioral level and higher than that of the RT level.

The operation of a semiconductor device (macro block) to be designed is described in an algorithm description 1 at the behavioral level using a higher-order language such as C or C++. The behavioral synthesis unit 101 applies behavioral synthesis to the algorithm description 1 to generate an RTL description 2, and generates a clock-level description 3 and synthesis information 4 at the clock level. The RTL description 2 obtained by behavioral synthesis is a structural description. This is a description that undergoes logic synthesis to decide the specific gates of the semiconductor device to be designed. The clock-level description 3 is a description obtained by converting untimed behavior of the semiconductor device to be designed, which is described in the algorithm description 1, to behavior in clock units under prescribed constraining conditions. The synthesis information 4 includes information such as resource constraint at the time of behavioral synthesis.

The clock-level simulation unit 102 executes a cycle-based simulation in an environment constructed by the clock-level description 3 and synthesis information 4, which are obtained by behavioral synthesis, and a description 5 for simulation in which are described the operation of an IP core such as a CPU core contained in the semiconductor device together with the blocks to be designed, and the path model. In this simulation, a mechanism that calculates toggles is incorporated in variable types corresponding to registers and memories. Operating ratios that indicate toggle rates or toggle transition probabilities are calculated by counting the toggles of the portions corresponding to storage elements or arithmetic units to be included in the semiconductor device to be designed.

The storage elements and arithmetic units included in the clock-level description are in one-to-one correspondence with the storage elements and arithmetic units subsequently put into hardware form by logic synthesis of the RTL description 2. The clock-level simulation unit 102 refers to a power-calculation-formula file 6, in which a formula for calculating the power consumption of each portion such as the storage elements, arithmetic units and multiplexers of the semiconductor device to be designed has been stored, to calculate the power consumption of each of these portions using the operating ratios obtained by simulation.

The storage-element power calculation unit 103 calculates the power consumption of circuit portions corresponding to the storage elements that are to construct the semiconductor device by using the operating ratios of the storage elements obtained by simulating the clock-level description 3. On the basis of the operating ratios of the storage elements or arithmetic units obtained by simulation, the combinational-circuit power calculation unit 104 calculates the power consumption of combinational logic circuits other than storage elements that are to construct the semiconductor device to be designed, and that include arithmetic units. The CTS/leakage power calculation unit 105 calculates the power of CTS (Clock Tree Synthesis) of the semiconductor device to be designed and calculates the overall leakage power of the semiconductor device. The clock-level simulation unit 102 outputs, as an estimated output value 7 of the semiconductor device to be designed, a power consumption that is the total of the power consumption of circuit portions corresponding to the storage elements, the power consumption of circuit portions corresponding to the combinational circuits, the power consumption of circuit portions corresponding to CTS and the leakage power.

Figure 2:
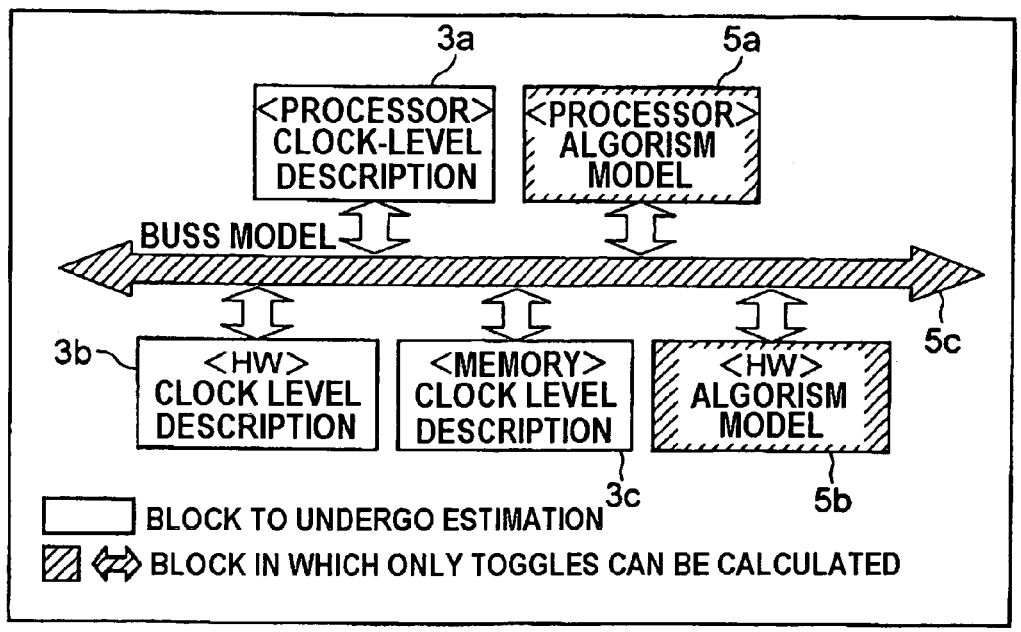
FIG. 2 is a block diagram illustrating a simulation environment by a clock-level simulation unit.

FIG. 2 illustrates the simulation environment according to the clock-level simulation unit 102. The clock-level simulation unit 102 constructs a simulation environment using a processor section 3a, hardware section 3b and memory section 3c described by the clock-level description 3, and a processor section 5a, memory section 5b and bus section 5c described by the description 5 for simulation. In this simulation environment, the processor section 5a, memory section 5b and bus section 5c described by the description 5 for simulation are blocks capable only of having their toggles calculated. The power-consumption estimating apparatus 100 utilizes the simulation environment thus constructed to estimate the power consumption of the processor section 3a, hardware section 3b and memory section 3c described in the clock-level description 3.

Figure 3:
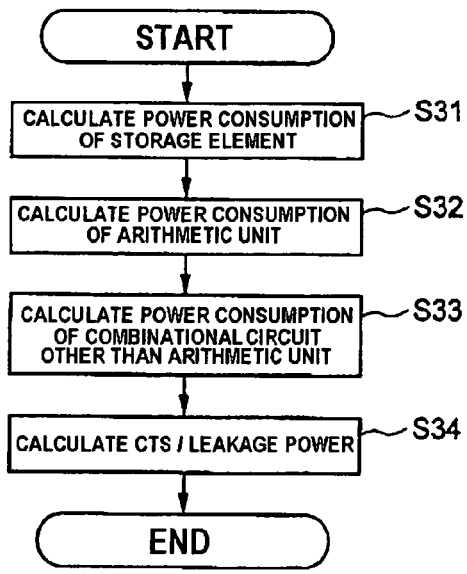
FIG. 3 is a flowchart illustrating a procedure for estimating power consumption of each portion in a semiconductor device to be designed.

FIG. 3 illustrates the procedure for estimating power consumption. A data sheet (power calculation formula) ordinarily is provided for storage elements such as flip-flops and memories. The data sheet is capable of obtaining power consumption from the area and operating frequency of the element when it has been put into hardware form. The power calculation formula is stored in the power-calculation-formula file 6. The storage-element power calculation unit 103 reads in from the power-calculation-formula file 6 the power calculation formula of the storage element whose power consumption is to be calculated, calculates the operating frequency from the toggle rate of the storage element obtained by simulation and estimates the predicted value of power consumption with regard to each storage element (step S31).

By way of example, the storage-element power calculation unit 103 reads Equation (1) below out of the power-calculation-formula file 6 with respect to a flip-flop and calculates a predicted value of power consumption of the flip-flop portion based upon Equation (1) using the operating ratio as the number of toggles of data pins/number of toggles of clock pins and using the frequency as the (number of toggles of clock pins/number of simulation cycles)×system frequency.

$$\text{Power }(FF) = (\text{power coefficient} \times \text{operating ratio} + \text{power constant}) \times \text{number of grids} \times \text{frequency} \quad (1)$$

Here the number of toggles of a data pin is the number of changes of a variable declared as a register, and the number of toggles of a clock pin is the number of simulation cycles when clock gating is not taken into account. The power coefficient and power constant in Equation (1) are values set in accordance with the technologies of the semiconductor device to be designed. The number of grids corresponds to the area of the flip-flop when it has been put into hardware form.

The storage-element power calculation unit 103 reads Equation (2) below out of the power-calculation-formula file 6 with respect to a memory and calculates a predicted value of power consumption of the memory portion based upon Equation (2) using the read (write) frequency as the number of read (write) cycles/(number of read cycles+number of write cycles) and using the operating ratio as the (number of read cycles+number of write cycles)/number of simulation cycles.

$$\text{Power (memory)} = (I\_read + I\_write) \times Vdd \quad (2)$$

where the following holds:

$I\_read$=power coefficient 0×number of words+power coefficient 1×number of bits+power coefficient 2×number of words×number of bits+power constant 0)×read frequency×operating ratio $I\_write$=power coefficient 3×number of words+power coefficient 4×number of bits+power coefficient 5×number of words×number of bits+power constant 1)×write frequency×operating ratio The power coefficient and power constant in Equation (2) are values set in accordance with the technologies of the semiconductor device to be designed.

With reference again to FIG. 3, the combinational-circuit power calculation unit 104 divides the combinational circuit portion that is to construct the semiconductor device into an arithmetic unit section and a combinational circuit section other than arithmetic units and first calculates a predicted value of power consumption of the arithmetic unit section (step S32). With regard to the arithmetic unit section in the combinational circuit portion, the operating ratio thereof is obtained by a simulation of the clock-level description 3 in a manner similar to that of the storage element. At step S32, the combinational-circuit power calculation unit 104 reads in the power calculation formula of the arithmetic unit indicated by Equation (3) below from the power-calculation-formula file 6 and calculates the predicted value of the power consumption using the toggle rate of the arithmetic unit obtained by simulation.

$$\text{Power (arithmetic unit)} = \text{power coefficient} \times \text{operating ratio} \times \text{number of grids of the arithmetic unit section} \times \text{frequency} \quad (3)$$

where the following holds:

operating ratio=number of toggles of arithmetic unit/ number of simulation cycles frequency=system frequency and the power coefficient is a value set in accordance with the technologies of the semiconductor device to be designed.

Unlike the RTL description 2, the clock-level description 3 of the combinational circuit does not hold the structure of the combinational circuit section other than an arithmetic unit constructed as, e.g., a multiplexer, and cannot estimate the structure of a multiplexer in RTL description 2. With a simulation of the clock-level description 3, therefore, the toggle rate of this portion cannot be obtained. Further, even if the structure of a multiplexer in the RTL description 2 can be estimated, a gate-level circuit is obtained by logic synthesis of the RTL description 2. Consequently, the structure of a gate-level multiplexer cannot be predicted from the clock-level description 3.

Figure 4:
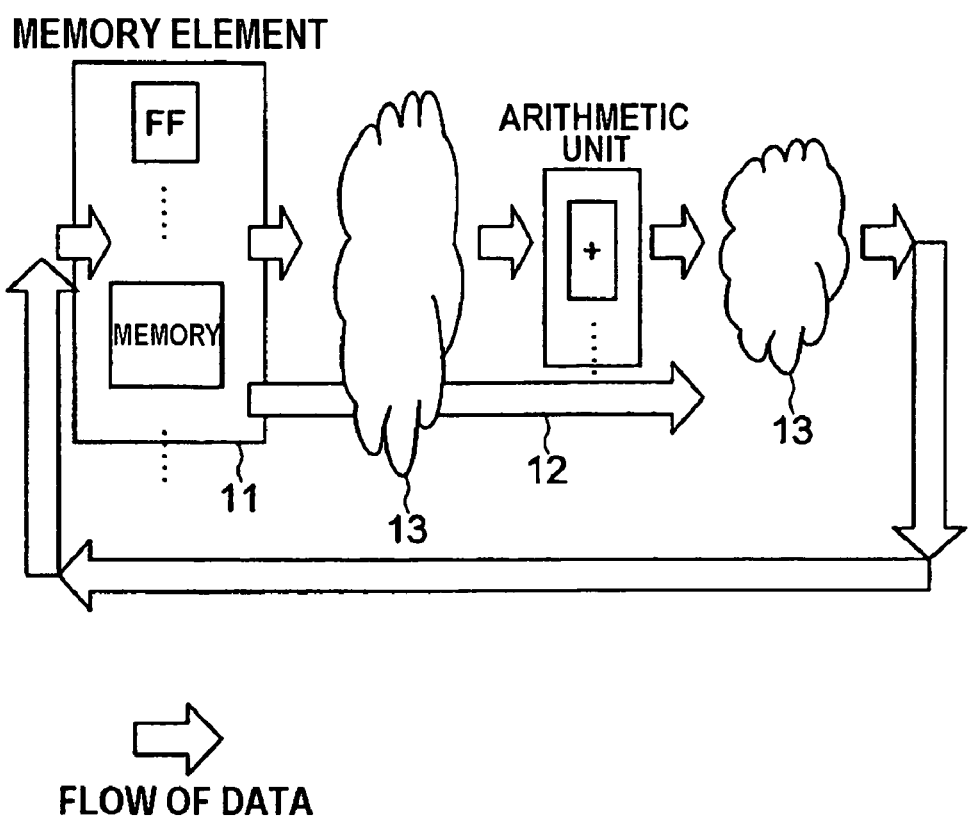
FIG. 4 is a block diagram illustrating a data path contained in a semiconductor device to be designed.

As shown in FIG. 4, usually data is input to a combinational circuit section other than an arithmetic unit from a storage element 11 or arithmetic unit 12, and the combinational circuit section outputs the data to a storage element 11 or arithmetic unit 12. Alternatively, data enters from an input port of data of a semiconductor device to be designed and the data is output to an output port. Consequently, although the accurate number of toggles of a combinational circuit 13 other than an arithmetic unit cannot be obtained by simulation, the toggles of this portion can be estimated based upon the toggles of the storage element 11 and arithmetic unit 12 or the toggles of the input/output port (not shown). Accordingly, the combinational-circuit power calculation unit 104 calculates a predicted value of power consumption of the combinational circuit 13 other than the arithmetic unit using the power calculation formula read in from the power-calculation-formula file 6 and the operating ratio obtained by estimation (step S33 in FIG. 3).

Figure 5:
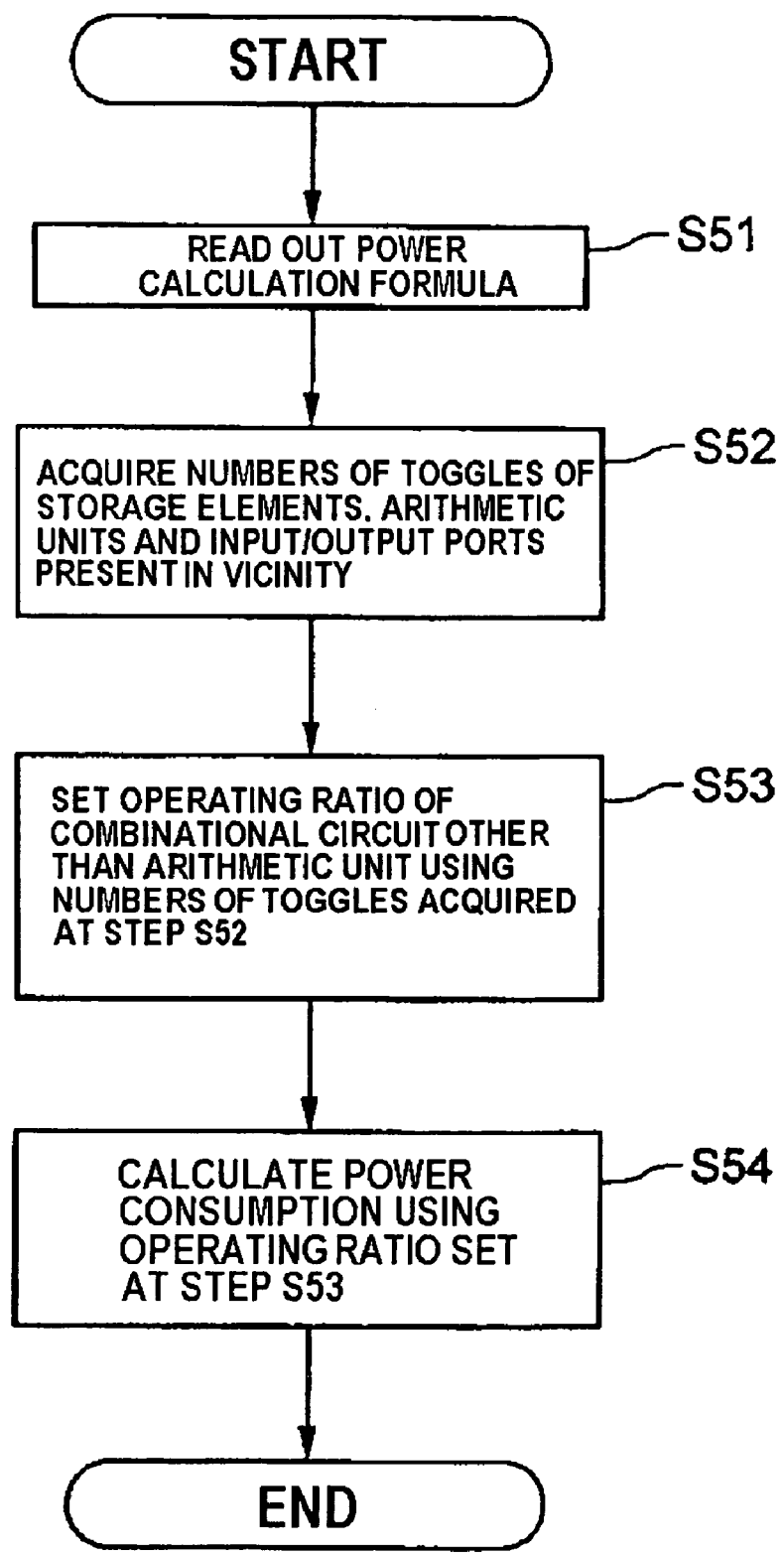
FIG. 5 is a flowchart illustrating the details of a procedure for calculating power consumption of a combinational circuit other than an arithmetic unit.

FIG. 5 is a flowchart illustrating the details of a procedure for calculating the power consumption of the combinational circuit 13 other than the arithmetic unit at step S33 in FIG. 3. The combinational-circuit power calculation unit 104 reads Equation (4) below, which is used to calculate the power consumption of the combinational circuit 13 out of the power-calculation-formula file 6 (step S51).

Power(combinational circuit other than arithmetic unit)=power coefficient×operating ratio×number of grids of combinational circuit other than arithmetic unit×frequency   (4)

where frequency=system frequency, the power coefficient is a value set in accordance with the technologies of the semiconductor device to be designed and the operating ratio is set in the manner described below.

The combinational-circuit power calculation unit 104 determines whether the storage element 11, arithmetic unit 12 or input/output port exists in the vicinity (the data bus on either side) of the combinational circuit 13 (FIG. 4) other than the arithmetic unit and, if one or more of the storage elements 11, arithmetic units 12 or input/output ports exists, obtains the number of toggles thereof (step S52). When one or more storage elements 11 exist in the vicinity of the combinational circuit 13 other than the arithmetic unit, for example, the combinational-circuit power calculation unit 104 obtains the average number of toggles thereof. When one or more arithmetic units exist in the vicinity of the combinational circuit 13, the combinational-circuit power calculation unit 104 obtains the average number of toggles thereof.

The combinational-circuit power calculation unit 104 estimates the operating ratio of the combinational circuit 13 other than the arithmetic unit based upon the numbers of toggles found at step S52 (step S53). For example, when one or more storage elements 11 only exist in the vicinity of the combinational circuit 13, the combinational-circuit power calculation unit 104 assumes that the average number of toggles of these storage elements 11 and the average number of toggles of the combinational circuit 13 are equal and calculates the operating ratio as follows: operating ratio=average number of toggles of storage elements 11/number of simulation cycles. Alternatively, when one or more arithmetic units 12 only exist in the vicinity of the combinational circuit 13, the combinational-circuit power calculation unit 104 calculates the operating ratio as follows: operating ratio=average number of toggles of arithmetic units 12/number of simulation cycles. When one or more input/output ports only exist in the vicinity, the combinational-circuit power calculation unit 104 calculates the operating ratio as follows: operating ratio=average number of toggles of input/output ports/number of simulation cycles. When one or more storage elements 11 and one or more arithmetic units 12 exist in the vicinity, the combinational-circuit power calculation unit 104 calculates the operating ratio as follows: operation ratio=(average of average number of toggles of storage elements 11 and average number of toggles of arithmetic units 12)/number of simulation cycles. The combinational-circuit power calculation unit 104 calculates the power consumption of the combinational circuit 13 other than the arithmetic unit using the operating ratio estimated at step S53 (step S54).

With reference again to FIG. 3, the CTS/leakage power calculation unit 105 calculates the predicted value of power by the CTS to be formed in the semiconductor device to be designed and calculates the leakage power of the semiconductor device (step S34). The CTS/leakage power calculation unit 105 assumes that CTS is laid within a block implemented by operation described in the clock-level description 3, lays CTS wiring virtually and calculates a predicted value of power consumption of CTS at a stage prior to that at which the actual layout information is obtained.

Figure 6:
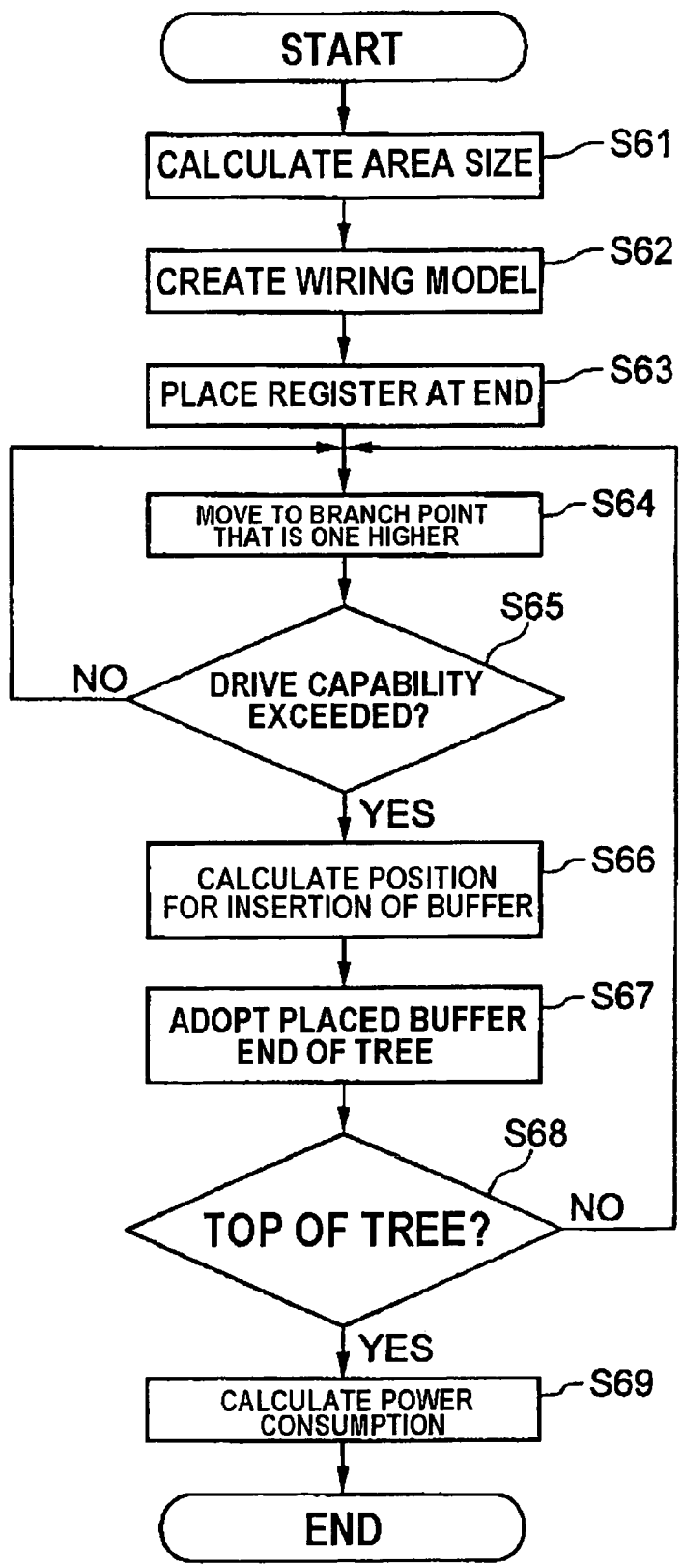
FIG. 6 is a flowchart illustrating the details of a procedure for CTS power estimation.
Figure 7:
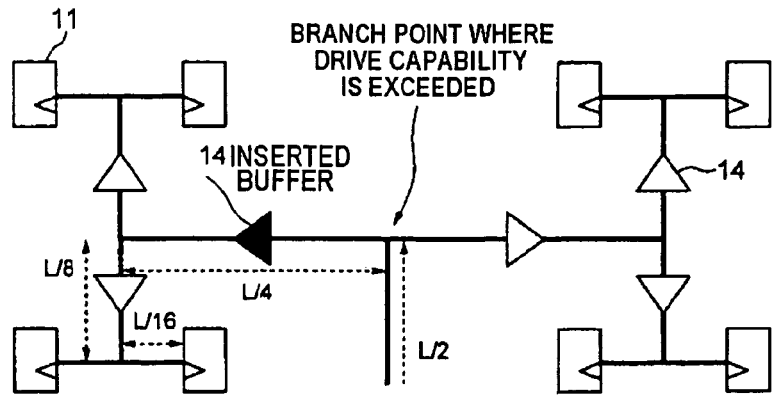
FIG. 7 is a block diagram illustrating an H-tree wiring model.
Figure 8:
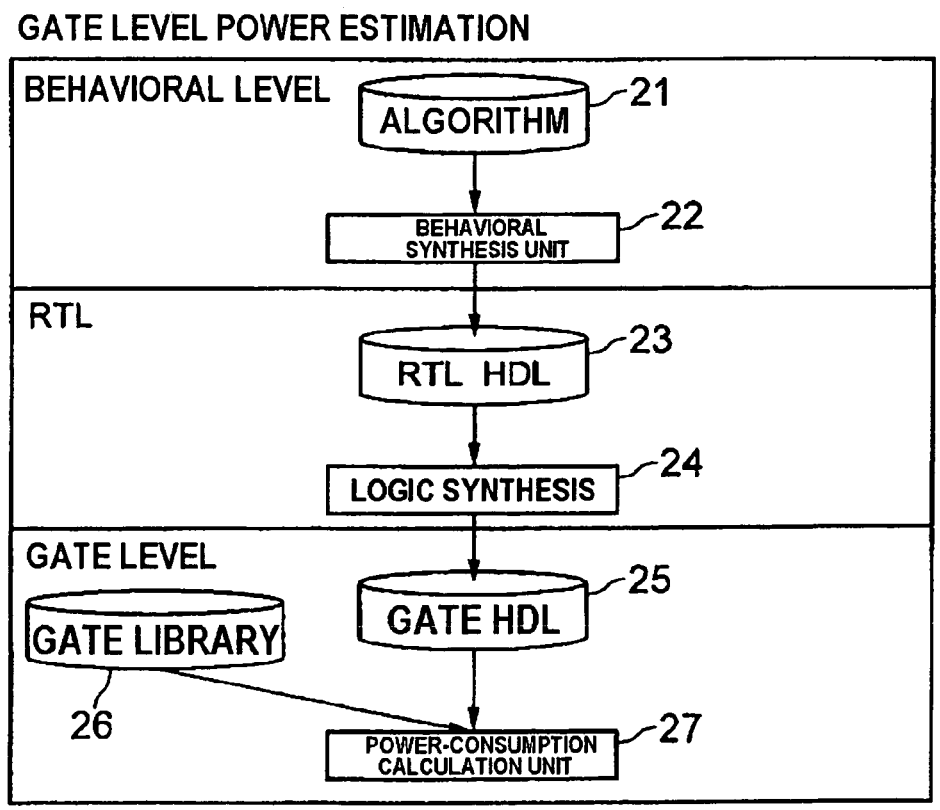
FIG. 8 is a block diagram illustrating estimation of power consumption at the gate level in top-down design.
Figure 9:
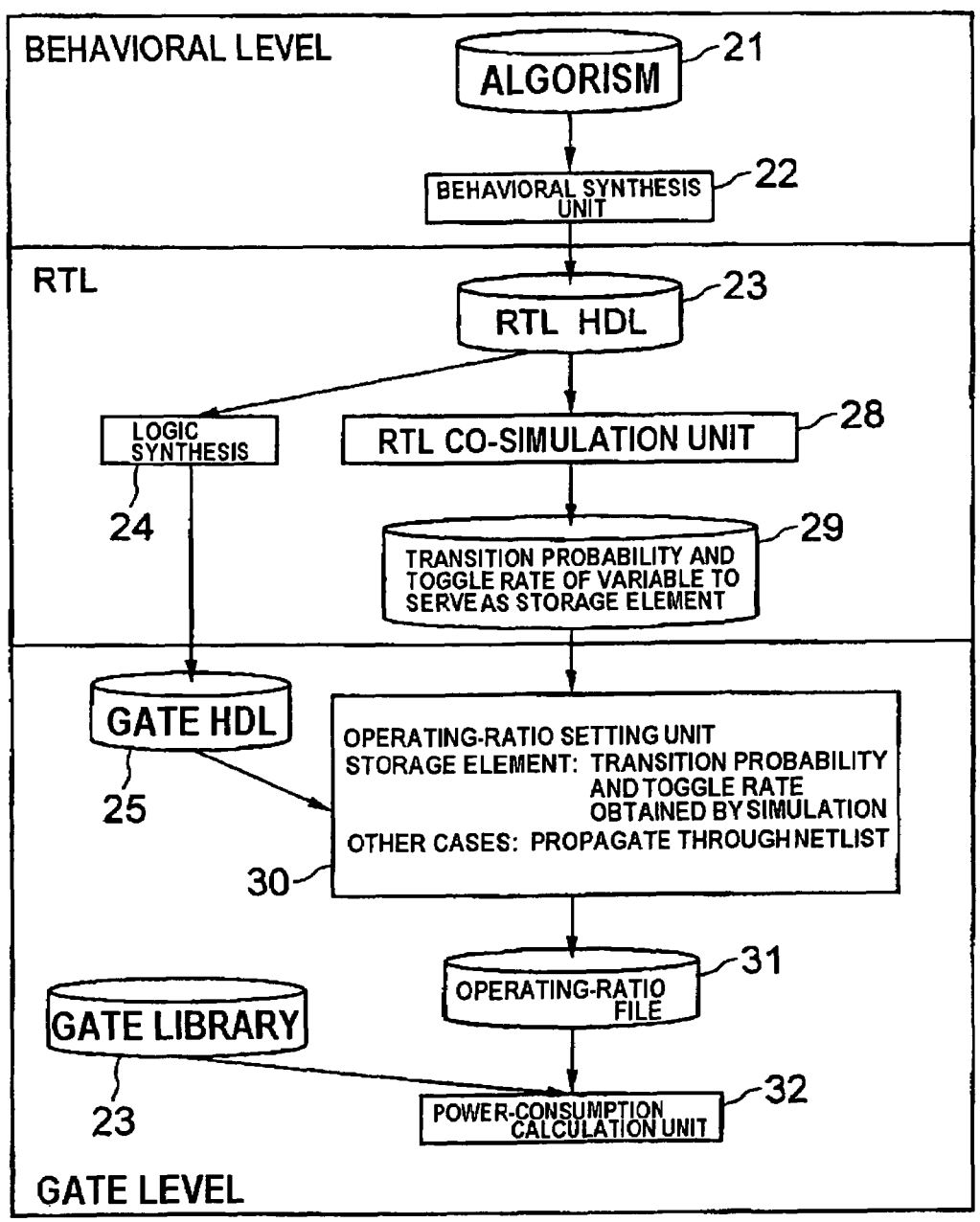
FIG. 9 is a block diagram illustrating how power consumption is estimated at the RT level.
Figure 10:
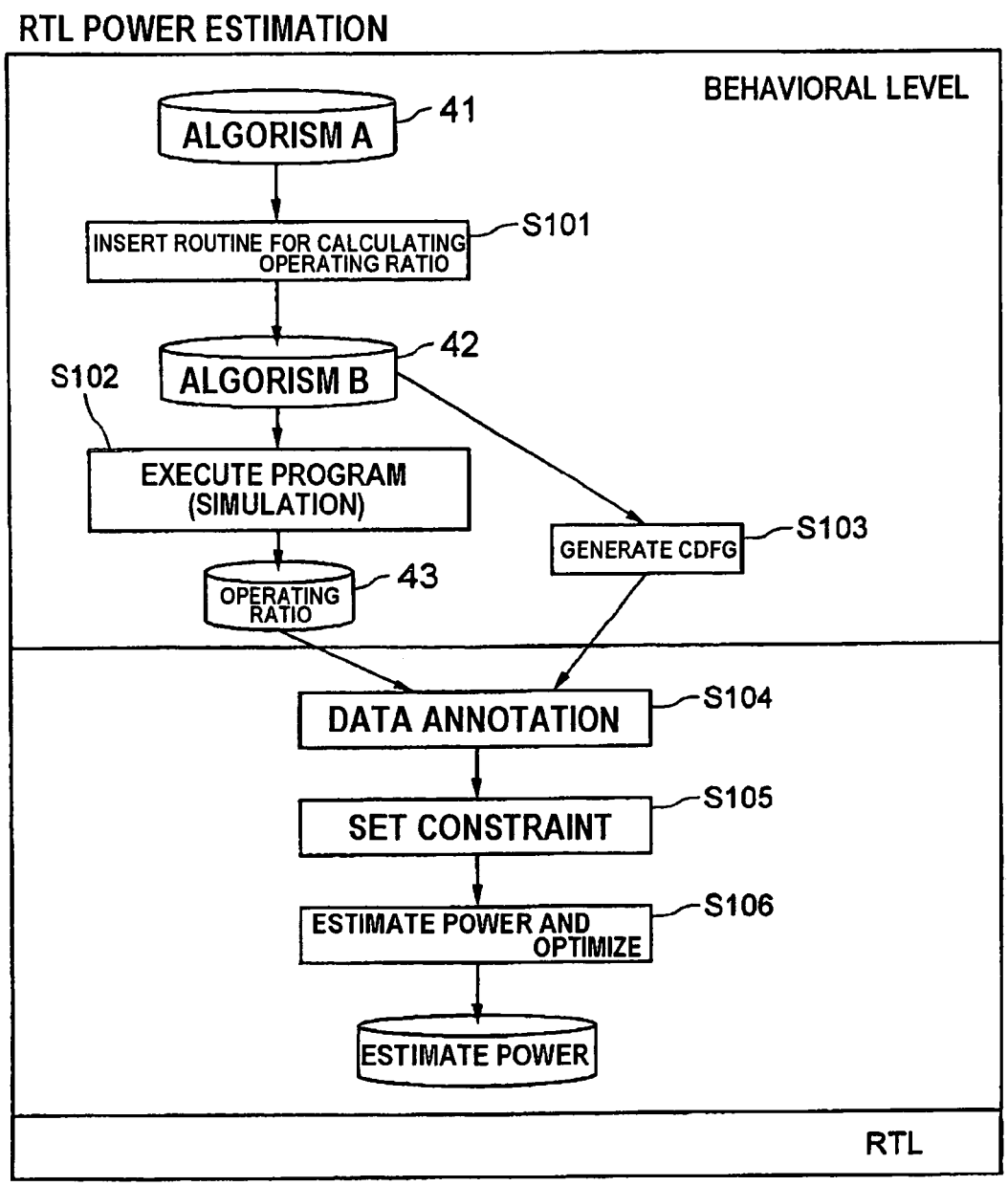
FIG. 10 is a block diagram illustrating estimation of power consumption described in Non-Patent Document 1.

FIG. 6 is a flowchart illustrating the details of a procedure for estimating CTS power. The CTS/leakage power calculation unit 105 calculates the area size over which CTS is laid (step S61) based upon the number of storage elements included in the clock-level description 3 and forms a wiring model in an H-tree (step S62). FIG. 7 illustrates the H-tree wiring model. One storage element 11 each is placed at the ends of the H-tree (step S63). The point moves from an end of the H-tree to a branch point that is one higher (step S64) and it is determined whether the drive capability of a buffer farther upstream of the branch point will be exceeded if a buffer 14 is not placed in the wiring up to the branch point (step S65). When it has been determined that the drive capability will not be exceeded even if the buffer 14 is not deployed, control returns to step S64 and the point moves to a branch point farther upstream.

When it has been determined at step S65 that the drive capability of the buffer 14 has been exceeded, the CTS/leakage power calculation unit 105 calculates a position for insertion of the buffer 14 up to the branch point at which it was determined that the drive capability will be exceeded (step S66). The position of the inserted buffer 14 is adopted as an end of the H-tree (step S67) and it is determined whether this position is the top of the H-tree (step S68). When it is determined that the position is not the top of the H-tree, control returns to step S64 and the point is moved to a branch point that is one higher. The CTS/leakage power calculation unit 105 repeatedly executes steps S64 to S68 until it is determined at step S68 that the position is the top of the H-tree, thereby deciding the structure of the CTS tree.

The relationship between the capacitance driven by the buffer 14 and power consumption is stored as a table, for every type of buffer 14, in the power-calculation-formula file 6. The CTS/leakage power calculation unit 105 reads Equation (5) below out of the power-calculation-formula file 6 and calculates a predicted value of power consumption of CTS (step S69).

Power(CTS)=ΣPower_table(capacitance, buffer type)×system frequency   (5)

Further, the CTS/leakage power calculation unit 105 reads Equation (6) below, which is for calculating leakage power, out of the power-calculation-formula file 6 and calculates a predicted value of leakage power based upon a power coefficient that has been set in accordance with technology and gate size that has been estimated from the clock-level description 3. The gate size is estimated from the amount of description of the clock-level description 3, by way of example.

Power (leakage)=power coefficient×gate size   (6)

The clock-level simulation unit 102 estimates the power consumption of the semiconductor device by totaling the power consumption of storage element portions, arithmetic unit portions, combinational circuit portions other than arithmetic units, CTS and leakage power, which have been calculated as described above.

According to this embodiment, a simulation is performed at the clock level, which is higher than the RT level, the operating ratios of storage element and arithmetic unit portions are obtained and a predicted value of the power consumption of these portions is calculated. When the simulation using the clock-level description 3 and the simulation using the RTL description 2 are compared, it is found that the clock-level description 3 involves less description since it does not possess structure in the manner of the RTL description 2, and the simulation using the clock-level description 3 can be performed at a higher speed. As a result, the estimation of power consumption can be carried out at high speed.

With regard to the storage element and arithmetic unit portions of the clock-level description 3, there is one-to-one correspondence with the gate-level circuits obtained by logic synthesis of the RTL description 2. As a result, the power consumptions of these portions can be estimated with a precision that same as that in a case where simulation is performed at the RT level. In comparison with a case where simulation is performed at the behavioral level as in Non-Patent Document 1, therefore, the accuracy of the estimation of power consumption can be improved. Further, the clock-level description 3 is capable of being described in the programming language C or C++ in a manner similar to that of algorithm description 1, and an advantage is that affinity with software, etc., is strengthened and the clock-level description 3 can be used ideally in system verification.

According to this embodiment, the power of a combinational circuit other than an arithmetic unit is estimated using the average operating ratio of at least one of storage elements and arithmetic units that exist in a data path on both sides. With a simulation using the clock-level description 3, operating ratio cannot be found with regard to a combinational circuit other than an arithmetic unit. However, by using the operating ratios of storage elements, etc., residing in the data path on both sides, as in this embodiment, it is possible to estimate the power consumption of a portion corresponding to a combinational circuit other than an arithmetic unit.

Since CTS consumes a large amount of power in a semiconductor device to be designed, it is desired that the power consumption be estimated at a design stage that is as early as possible. Conventionally, however, it is difficult to estimate the power consumption of CTS at an early stage where there is no layout information. According to this embodiment, the CTS/leakage power calculation unit 105 lays CTS wiring virtually and calculates a predicted value of CTS power consumption. As a result, the power consumption of this portion can be estimated at a stage prior to that at which actual layout information is obtained.

It should be noted that in a case where clock gating is performed in behavioral synthesis by the behavioral synthesis unit 101, RTL description 2 is generated in such a manner that a gating circuit in which a clock signal is not input to a flip-flop is generated when there is no writing of data to the flip-flop, by way of example. However, the clock-level description 3 does not possess information relating to clock gating. In a case where clock gating is taken into account, therefore, the power consumption of the flip-flop portion cannot be calculated correctly as is. If clock gating is taken into consideration, it will suffice to calculate power consumption upon assuming that a clock signal will be input to a storage element only when data is rewritten. More specifically, when a storage element, for example, is constructed as a flip-flop, it will suffice to calculate power consumption upon replacing the number of toggles of a clock pin in Equation (1) with number of writes of a variable declared as a register, assuming that a clock signal will be input to the clock terminal of this flip-flop at the time of data write.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A power-consumption calculation method for calculating a predicted value of power consumption of a semiconductor device to be designed, comprising the steps of:

simulating a clock-level description in which operation of the semiconductor device to be designed is described as clock-level operation;

calculating operating ratios of storage elements and arithmetic units indicated by the clock-level description;

calculating a predicted value of power consumption of each storage element and each arithmetic unit based upon the calculated operating ratios of the storage elements and arithmetic units and power calculation formulae corresponding to respective ones of the storage elements and arithmetic units; and calculating a predicted value of power consumption of a combinational circuit other than arithmetic units based upon the calculated operating ratios of the storage elements and arithmetic units and a power calculation formula prepared in conformity with the combinational circuit other than arithmetic units.

2. The method according to claim 1, wherein said step of calculating a predicted value calculates the power consumption of each storage element on the assumption that a clock signal is input only when data is written to the storage element.

3. The method according to claim 1, wherein if one or more of each of a storage element and arithmetic unit exist on a data path bracketing a combinational circuit other than arithmetic units to be calculated, said step of calculating a predicted value of power consumption of a combinational circuit other than arithmetic units calculates a predicted value of power consumption of the combinational circuit other than arithmetic units using the operating ratios of the one or more storage elements and arithmetic units.

4. The method according to claim 1, wherein if one or more storage elements exist on a data path bracketing a combinational circuit other than arithmetic units to be calculated, said step of calculating a predicted value of power consumption of a combinational circuit other than arithmetic units calculates a predicted value of power consumption of the combinational circuit other than arithmetic units using the operating ratios of the one or more storage elements.

5. The method according to claim 1, wherein if one or more arithmetic units exist on a data path bracketing a combinational circuit other than arithmetic units to be calculated, said step of calculating a predicted value of power consumption of a combinational circuit other than arithmetic units calculates a predicted value of power consumption of the combinational circuit other than arithmetic units using the operating ratios of the one or more arithmetic units.

6. The method according to claim 1, further comprising a step of assuming gate size based upon the clock-level description, and calculating a predicted value of leakage power based upon the gate size assumed.

7. A power-consumption calculation method for calculating a predicted value of power consumption of a semiconductor device to be designed, comprising the steps of:

simulating a clock-level description in which operation of the semiconductor device to be designed is described as clock-level operation, calculating operating ratios of storage elements and arithmetic units indicated by the clock-level description;

calculating a predicted value of power consumption of each storage element and each arithmetic unit based upon the calculated operating ratios of the storage elements and arithmetic units and power calculation formulae corresponding to respective ones of the storage elements and arithmetic units;

assuming a virtual wiring area based upon the clock-level description and carrying out wiring of Clock-Tree-Synthesis CTS wiring in the virtual wiring area while calculating positions of buffers, which are inserted into the virtual wiring, based upon driving capability of the buffers and wiring capacitance of the virtual wiring; and calculating a predicted value of power consumption by CTS based upon number of buffers that have been inserted into the virtual wiring at said step of wiring the CTS wiring.

8. A power-consumption calculation apparatus for simulating a clock-level description in which operation of a semiconductor device to be designed is described as clock-level operation and calculating a predicted value of power consumption of a semiconductor device to be designed, comprising:

storage-element power calculation means for calculating operating ratios of storage elements indicated by the clock-level description, and calculating a predicted value of power consumption of each storage element based upon the calculated operating ratios of the storage elements and a calculation formula for calculating power consumption of the storage elements;

combinational-circuit power calculation means for calculating operating ratios of arithmetic units indicated by the clock-level description, and means for calculating a predicted value of power consumption of each arithmetic unit based upon the calculated operating ratios of the arithmetic units and a power calculation formula for calculating power consumption of the arithmetic units;

wherein said combinational-circuit power calculation means further calculates a predicted value of power consumption of the combinational circuit other than the arithmetic units based upon a power calculation formula for calculating power consumption of a combinational circuit other than the arithmetic units, the calculated operating ratios of the arithmetic units and operating ratios of the storage elements calculated by said storage-element power calculation means.

9. The apparatus according to claim 8, wherein said storage-element power calculation means calculates a predicted value of power consumption of each storage element on the assumption that a clock signal is supplied only when data is written to the storage element.

10. The apparatus according to claim 8, wherein if one or more of each of a storage element and arithmetic unit exist on a data path bracketing a combinational circuit other than arithmetic units to be calculated, said combinational-circuit power calculation means calculates a predicted value of power consumption of the combinational circuit other than the arithmetic units using the operating ratios of the one or more storage elements and arithmetic units.

11. The apparatus according to claim 8, wherein if one or more storage elements exist on a data path bracketing a combinational circuit other than arithmetic units to be calculated, said combinational-circuit power calculation means calculates a predicted value of power consumption of the combinational circuit other than arithmetic units using the operating ratios of the one or more storage elements.

12. The apparatus according to claim 8, wherein if one or more arithmetic units exist on a data path bracketing a combinational circuit other than arithmetic units to be calculated, said combinational-circuit power calculation means calculates a predicted value of power consumption of the combinational circuit other than arithmetic units using the operating ratios of the one or more arithmetic units.

13. The apparatus according to claim 8, further comprising leakage-power calculation means for assuming gate size based upon the clock-level description and calculating a predicted value of leakage power based upon the gate size assumed.

14. A power-consumption calculation apparatus for simulating a clock-level description in which operation of a semiconductor device to be designed is described as clock-level operation and calculating a predicted value of power consumption of a semiconductor device to be designed, comprising:

storage-element power calculation means for calculating operating ratios of storage elements indicated by the clock-level description, and calculating a predicted value of power consumption of each storage element based upon the calculated operating ratios of the storage elements and a calculation formula for calculating power consumption of the storage elements;

combinational-circuit power calculation means for calculating operating ratios of arithmetic units indicated by the clock-level description, and means for calculating a predicted value of power consumption of each arithmetic unit based upon the calculated operating ratios of the arithmetic units and a power calculation formula for calculating power consumption of the arithmetic units;

Clock-Tree-Synthesis CIS power calculation means for assuming a virtual wiring area based upon the clock-level description, carrying out wiring of CTS wiring in the virtual wiring area while calculating positions of buffers, which are inserted into the virtual wiring, based upon driving capability of the buffers and wiring capacitance of the virtual wiring; and means for calculating a predicted value of power consumption by CTS based upon number of buffers that have been inserted into the virtual wiring.

* * * * *